(12) United States Patent
Fukasawa

(10) Patent No.: US 7,336,403 B2
(45) Date of Patent: Feb. 26, 2008

(54) OPTICAL ELEMENT AND ILLUMINATION APPARATUS HAVING SAME

(75) Inventor: Motomu Fukasawa, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1082 days.

(21) Appl. No.: 10/439,239

(22) Filed: May 16, 2003

(65) Prior Publication Data

US 2003/0218811 A1 Nov. 27, 2003

(30) Foreign Application Priority Data

| May 27, 2002 | (JP) | ............................. 2002-152210 |
| Jul. 1, 2002 | (JP) | ............................. 2002-192064 |

(51) Int. Cl.
*H04N 1/04* (2006.01)

(52) U.S. Cl. ...................... 358/484; 358/474; 358/475; 358/497

(58) Field of Classification Search ................ 358/484, 358/475, 509, 497, 494, 474, 505, 473, 482, 358/483, 512–514; 250/227.11, 216, 239, 250/208.2, 234–236, 208.1; 399/211, 212; 362/30, 29, 800; 382/312, 313

See application file for complete search history.

(56) References Cited

U.S. PATENT DOCUMENTS

| 3,871,751 | A | 3/1975 | Rambauske et al. ......... 350/293 |
| 3,982,824 | A | 9/1976 | Rambauske ................. 350/294 |
| 4,751,553 | A | 6/1988 | Fukasawa |
| 4,794,427 | A | 12/1988 | Shirai et al. |
| 5,037,191 | A | 8/1991 | Cheng ......................... 359/858 |
| 5,235,470 | A | 8/1993 | Cheng ......................... 359/852 |
| 5,287,147 | A | 2/1994 | Fukasawa et al. |
| 5,475,571 | A * | 12/1995 | Dassanayake ............... 362/560 |
| 5,764,783 | A | 6/1998 | Ferralli ........................ 381/160 |
| 5,844,638 | A * | 12/1998 | Ooi et al. ..................... 349/10 |
| 5,875,377 | A | 2/1999 | Fukasawa |
| 6,072,171 | A | 6/2000 | Nakamura et al. .......... 250/216 |
| 6,088,164 | A | 7/2000 | Fukasawa |
| 6,123,436 | A * | 9/2000 | Hough et al. ................ 362/296 |

(Continued)

FOREIGN PATENT DOCUMENTS

JP    6-44267    6/1994

(Continued)

OTHER PUBLICATIONS

Search Report Issued on May 4, 2005, by the European Patent Office in Application No. 03253313.

(Continued)

*Primary Examiner*—Cheukfan Lee
(74) *Attorney, Agent, or Firm*—Fitzpatrick, Cella, Harper & Scinto

(57) ABSTRACT

An object of the present invention is to efficiently shape a light flux emitted from a light source into a linear shape and so as to provide an optical element having high versatility that can be widely used irrespective of the original sizes and to provide an illumination apparatus having such an illumination apparatus. The optical element has a reflection surface in the form of an inner side of a curved surface that is formed by rotating a parabola about a rotation axis including the focus of the parabola or a point near the focus of the parabola.

21 Claims, 10 Drawing Sheets

U.S. PATENT DOCUMENTS

| | | |
|---|---|---|
| 6,259,082 B1 | 7/2001 | Fujimoto et al. |
| 6,355,946 B1 | 3/2002 | Ishinaga .................. 257/98 |
| 6,801,298 B2 * | 10/2004 | Goldstein .................. 355/67 |
| 2002/0006039 A1 | 1/2002 | Ishinaga .................. 362/217 |

FOREIGN PATENT DOCUMENTS

| | | |
|---|---|---|
| JP | 11-52136 A | 2/1999 |
| WO | WO 98/20365 | 5/1998 |
| WO | WO 01/07828 | 2/2001 |

OTHER PUBLICATIONS

Notification of the First Office Action issued on Aug. 13, 2004, in Chinese Patent Application No. 03138421.8.

* cited by examiner

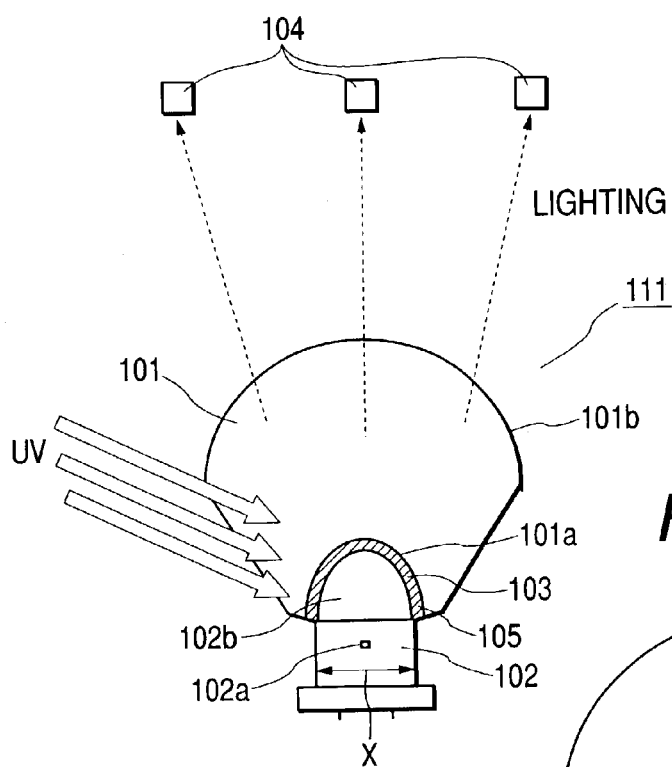
FIG. 15
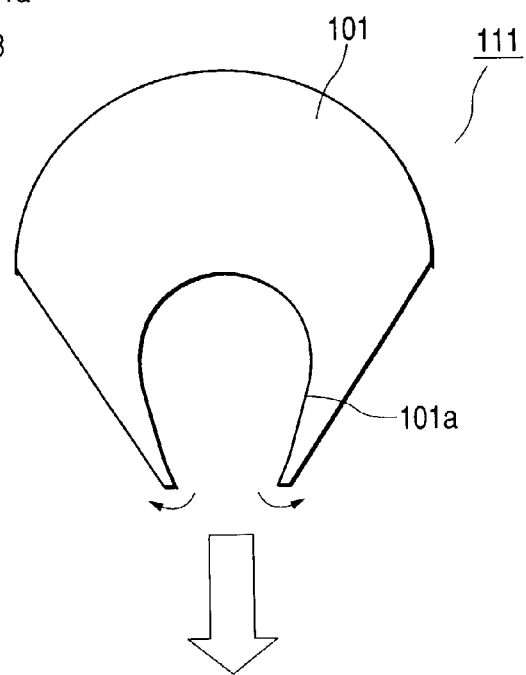
FIG. 16
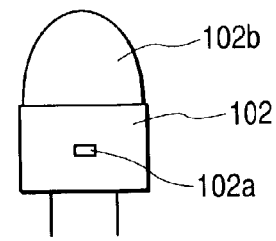

OPTICAL ELEMENT AND ILLUMINATION APPARATUS HAVING SAME

BACKGROUND OF THE INVENTION

1. Field of the Invention

The present invention relates to an optical element and an illumination apparatus having the same. More specifically, the present invention relates to an optical element or an illumination apparatus having an optical element in which a light flux emitted from light source means is shaped so that line illumination would be efficiently effected. The optical element and the illumination apparatus according to the present invention would be preferably used in an image reading apparatus that utilizes a one-dimensional line sensor.

2. Description of the Related Art

Recently, as an apparatus for providing a line illumination for an image reading apparatus, there have been proposed various illumination apparatus that uses a light source (a point source) composed of a semiconductor device and effectively converges a light flux emitted from the light source onto the surface of an original to be illuminated. The light source composed of a semiconductor device is adopted in view of its advantages that its power consumption and heat generation are little and it does not require any particular lighting device.

In this type of illumination apparatus, multiple light sources composed of semiconductor devices are arranged in the direction parallel to the line direction of the one-dimensional line sensor, and light fluxes emitted from the multiple light sources are converged onto the surface of an original by means of a single elongated reflecting member (or an optical element). Such an illumination apparatus was proposed by Japanese Patent Application Laid-Open No. 11-52136.

However, efficient light conversion is highly sensitive to manufacturing error, and therefore, a high accuracy in its shape and its maintenance is required. This causes the following problems.

(1) Since the size of the reflecting member is large, the mold used for manufacturing the same becomes large and its cost is very high.

(2) Since the size of the reflecting member is large, it would deform after detached from the mold due to residual stress applied during the molding.

(3) The relative positional relationship between the light source and the reflecting member is sensitive, and therefore curvature cannot be corrected satisfactorily.

(4) Since the reflecting member is designed in conformity with the size of the original, it lacks versatility.

SUMMARY OF THE INVENTION

An object of the invention is to provide an optical element and an illumination apparatus using the same that can efficiently shape a light flux emitted from a light source into a linear light flux and that can be generally used irrespective of the original size.

According to a first aspect of the present invention, there is provided an optical element having a reflecting surface in the form of an inner side of a curved surface that is formed by rotating a parabola about a rotation axis including the focus of the parabola.

In the optical element according to the first aspect of the invention, the curved surface may have a shape that is formed when the parabola is rotated about the rotation axis through the angular range of ±45° to ±90° from a reference position.

In the optical element according to the first aspect of the invention, the optical element may have a member used for assembling that is provided on a surface other than the reflecting surface.

In the optical element according to the first aspect of the invention, the optical member may have a transparent member provided in a part of a space to which the reflecting surface is opposed.

According to a second aspect of the present invention, there is provided an illumination apparatus comprising one or more illumination units each of which includes the optical element according to the first aspect of the invention or one of its modifications described above and light source means having a light emission point disposed at one focal point of the optical element, wherein said illumination apparatus illuminates a surface to be illuminated with a light flux from the light emission point via the optical element.

According to a third aspect of the present invention, there is provided an optical element having a reflecting surface in the form of an inner side of a curved surface that is formed by rotating an ellipse about a rotation axis including one of the focuses of the ellipse while changing the shape of the ellipse depending on a rotation angle of the ellipse about said rotation axis.

In the optical element according to the third aspect of the invention, the curved surface may have a shape in which the other focus of the ellipse for forming the curved surface is on a first virtual straight line.

In the optical element according to the third aspect of the invention, the curved surface may have a shape that is formed when the ellipse is rotated about the rotation axis through the angular range of ±45° to ±90° from a reference position.

In the optical element according to the third aspect of the invention, the optical element may have a member used for assembling that is provided on a surface other than the reflecting surface.

In the optical element according to the third aspect of the present invention, the optical member may have a transparent member provided in a part of a space to which the reflecting surface is opposed.

According to a fourth aspect of the invention there is provided an illumination apparatus comprising one or more illumination units each of which includes an optical element according to the third aspect of the present invention or one of its modifications described above and light source means having a light emission point disposed at one focal point of said optical element, wherein the illumination apparatus illuminates a surface to be illuminated with a light flux from the light emission point via the optical element.

In the illumination apparatus according to the fourth aspect of the invention, the transparent member may have an exit end surface of a substantially concentric circular arc shape with a center positioned on the rotation axis.

This illumination apparatus may be designed in such a way that the exit end surface of the transparent member does not have a curvature in the direction parallel to said rotation axis.

Alternatively, this illumination apparatus may be designed in such a way that the exit end surface of the transparent member has a curvature in the direction parallel to the rotation axis, the curvature varying in such a way that the power gradually decreases as the position shifts away from the first virtual straight line of the focus, the shape of the curved surface is such that the trajectory of the synthesized focus position determine taking into account the curvature imparted to the exit end surface corresponds to a second virtual straight line.

In the illumination apparatus described just above, with the curvature varying in such a way that the power gradually decreases as the position shifts away from the first virtual straight line of the focus, the image position of the light emission point may be on the first virtual straight line.

In the illumination apparatus according to the fourth aspect of the present invention, the curved surface may image a light flux emitted from said light emission point to form a focal line in a one-dimensional direction.

In this illumination apparatus or in the illumination apparatus according to the second or fourth aspect of the present invention, the illumination apparatus may have a multiple number of said illumination units, and the multiple illumination units are disposed on a first virtual straight line that is formed by the curved surface of the light emission point.

According to a fifth aspect of the present invention, there is provided an image reading apparatus for reading image information using on of the last two illumination apparatus described just above, or one of the illumination apparatus according to the second and fourth aspects of the present invention and imaging means for imaging image information that is linearly illuminated by the illumination apparatus onto a one-dimensional line sensor.

BRIEF DESCRIPTION OF THE DRAWINGS

FIG. 15 is a cross sectional view schematically showing the principal portion of a fourth embodiment of the present invention.

FIG. 16 is a cross sectional view schematically showing the principal portion of a modification according to the present invention.

DESCRIPTION OF THE PREFERRED EMBODIMENTS

First Embodiment

Figure 1:
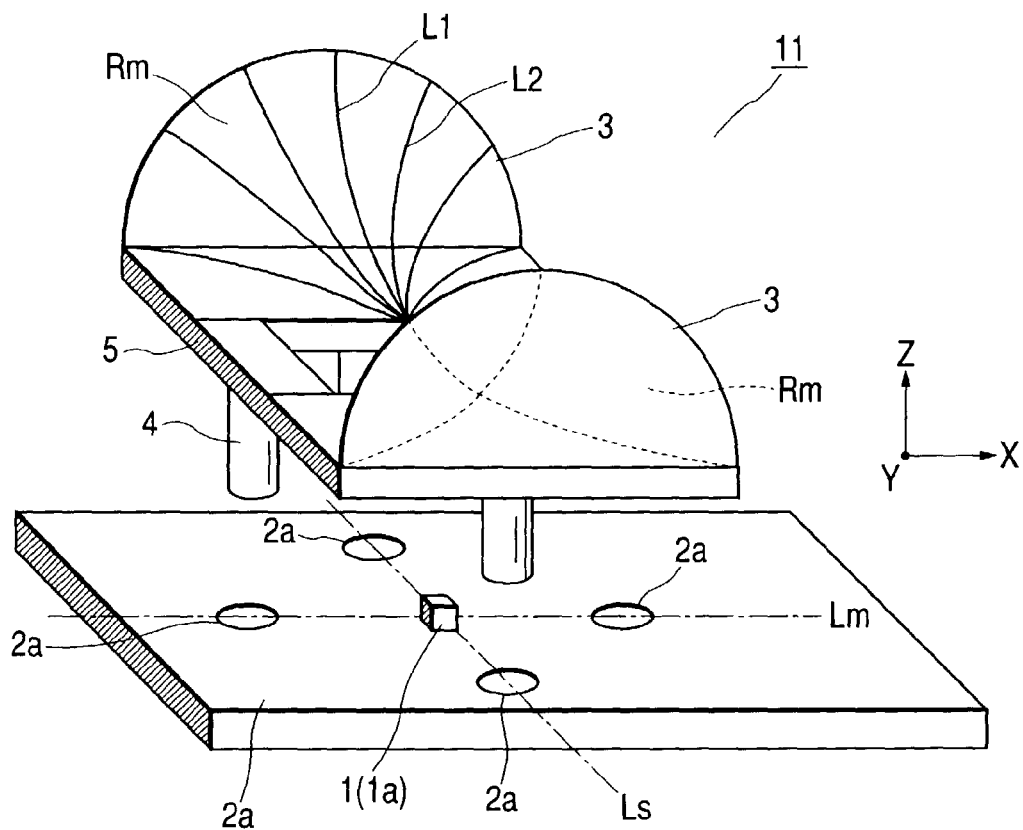
FIG. 1 is a perspective view schematically showing the principal portion of an illumination unit according to the first embodiment of the present invention.
Figure 2:
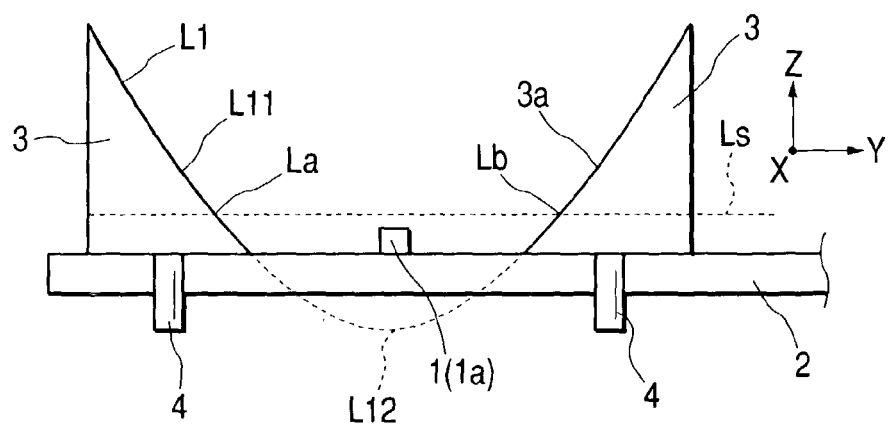
FIG. 2 is a cross sectional view taken at Y-Z plane in FIG. 1 (i.e. vertical cross sectional view).
Figure 3:
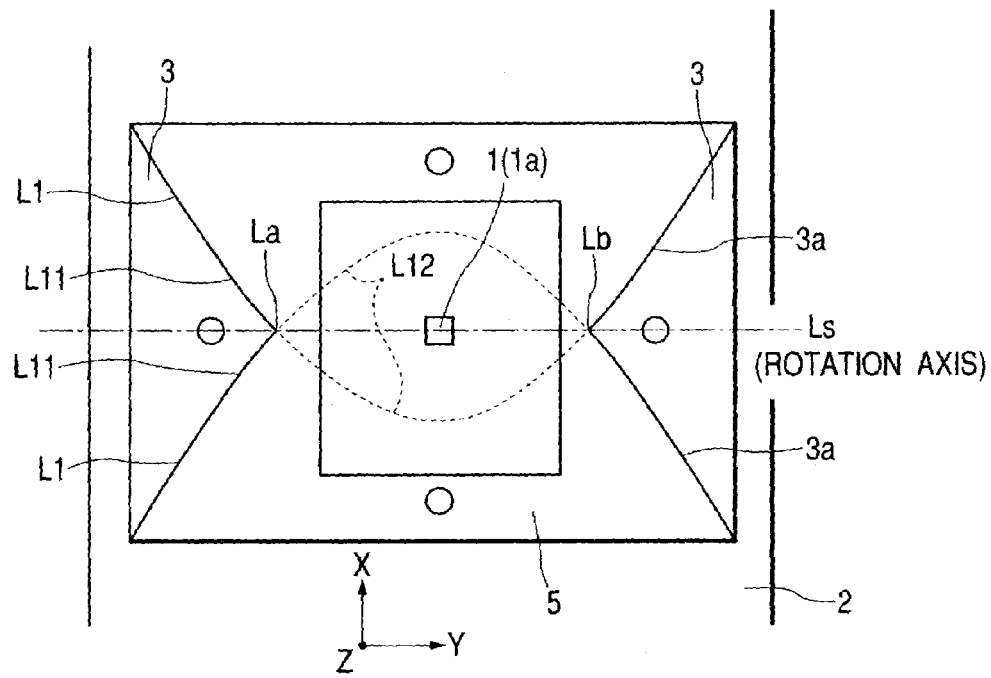
FIG. 3 is a cross sectional view taken at X-Y plane in FIG. 1 (i.e. horizontal cross sectional view).

FIG. 1 is a perspective view showing the principal part of an illumination apparatus using an optical element according to the present invention. FIG. 2 is a cross sectional view (a vertical cross section) taken at Y-Z plane in FIG. 1. FIG. 3 is a cross sectional view (a horizontal cross section) taken at X-Y plane in FIG. 1.

In FIG. 1, reference numeral 1 designates light source means composed of a light source (a point source) that is arranged in such a way that a light emission point (i.e. a chip) 1a is positioned at or in the vicinity of one of the focuses of the reflective curved surface that forms an optical element 3 (described later). The light source 1 is bonded on a substrate 2 at a predetermined position. The light source 1 comprises a semiconductor device that emits light from a light emission point 1a upon application of a voltage. Generally, the light source 1 is designed in such a way as to have such a light distribution characteristic in which the emitted light damps in a cosine pattern in the perpendicular direction (i.e. Z-direction) from the light emission point 1a. However, only a little part of the emitted light is effectively used for illuminating the original in the line direction (i.e. X-direction).

The optical element 3 is composed of a reflecting member having a curved surface shape for collecting a part of the light flux that would otherwise be ineffectively used. The reflecting member 3 has a reflective surface 3a that is a part of the inner side of a curved surface formed by rotating a parabola about a rotation axis Ls that intersects the focus of the parabola or a point in the vicinity of that focus. This curved surface has a surface shape that is formed when the parabola is rotated about the rotation axis through the angular range, from a reference position, of ±45° to ±90°. In this connection, the optical element 3 and the constituents of the light source means 1 are parts of an illumination unit (i.e. an illumination apparatus) 11.

The reflecting member 3 is made of a transparent medium such as a plastic or glass material.

On the non-reflective bottom surface that is different from the reflecting surface of the reflecting member 3, there is integrally formed positioning pins 4 serving as assembling members. These pins 4 are fitted into positioning holes 2a that are formed on the substrate 2 in advance. In the structure shown in FIG. 1, a frame member 5 for attaching the reflecting member 3 is provided and the positioning pins 4 are formed thereon in order for the assembling operation to be effected by a single step, but the reflecting member 3 may be divided into two parts having the same shape. In that case, the cost required for a mold can be reduced.

In the plane of substrate 2, a straight line Lm is defined as a line passing through the light source 1 and parallel to a reading line (the X-direction), and a straight line Ls is defined as a line orthogonal to the line Lm. Under the fitted state, an arbitral plane including the straight line Ls (i.e. such a plane that would be formed when a horizontal plane including the line Ls is rotated about the straight line Ls as the rotation axis) intersects the reflecting member 3 to form intersection lines La and Lb, which are parts of a quadratic curve L1, . . . , or Ln (see FIG. 4). In connection with this, the focus Fl of the quadratic curve L1 is at the position of the light source 1 or in the vicinity of the light source 1 within the range of a manufacturing error.

Figure 4:
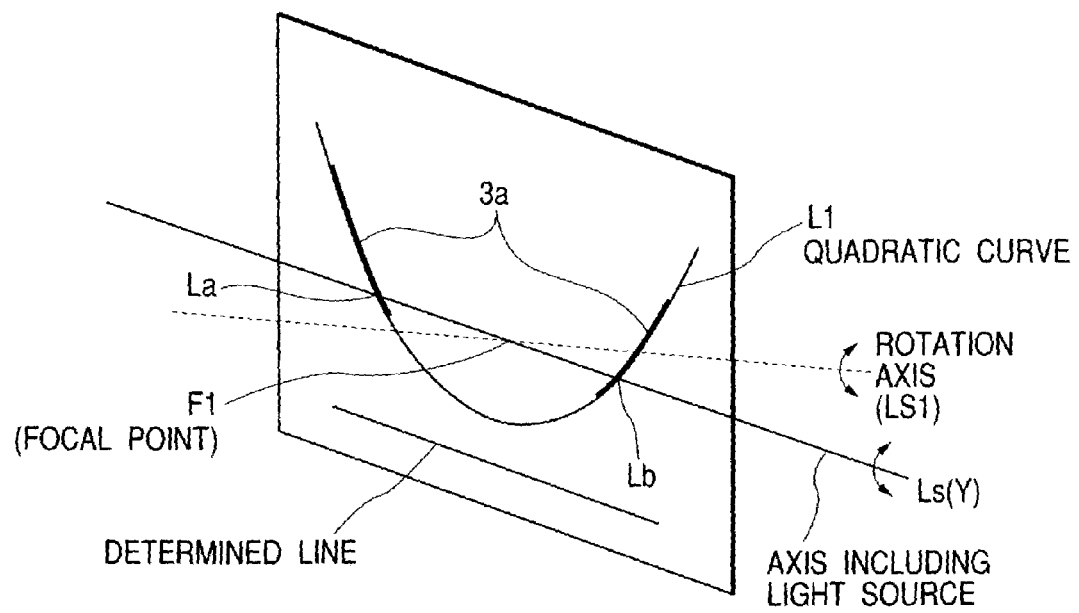
FIG. 4 is a drawing illustrating how a portion of a quadratic curve forms a reflecting surface.

The rotation axis Ls may be any line (for example, the rotation axis Ls1 shown by a broken line in FIG. 4) as long as it includes the focus F1 or a point in the vicinity of the focus F1. The optical element has the reflecting surface(s) 3a in the form of the inner side of a curved surface that is formed when the parabola is rotated about the rotation axis Ls. In other words, the reflecting member 3 has a reflecting surface Rm that is formed above the substrate 2 by rotating a predetermined parabola L1 having the focus positioned at the light source 1 about the straight line Ls as the rotation axis.

While in this embodiment, the reflecting surface Rm is formed by the rotation angle of 180° (180 degrees), the reflecting surface would be preferably formed by the rotation angle of 90° to 180° in view of its light distribution. A light flux emitted from the light emission point 1a may be directed downward to the transparent substrate, and the reflecting surface Rm may be arranged in conformity with the arrangement of such a light flux.

FIG. 2 is a vertical cross sectional view showing the substrate 2 under the state in which the reflecting member 3 is fitted into the substrate 2, taken at the plane including the line Ls. The quadratic curve L1 is a parabola having the focus at the position of the light source. The quadratic curve L1 is composed of curves L11 illustrated by solid lines existing above the substrate 2 and a curve L12 illustrated by a broken line beneath the substrate 2. A divergent light flux emitted from the light source 1 is reflected by the reflecting surface 3a of the reflecting member 3 so as to be converted into a parallel light flux, which is to be effectively used for illuminating the surface of an original (not shown).

FIG. 3 is a horizontal cross sectional view showing the substrate 2 under the state in which the reflecting member 3 is fitted into the substrate 2, taken at the plane including the line Ls. The quadratic curve L1 is a parabola having the focus at the position of the light source. The quadratic curve L1 is composed of curves L11 illustrated by solid lines existing above the substrate 2 and a curve L12 illustrated by a broken line beneath the substrate 2. A divergent light flux emitted from the light source 1 is, in FIG. 3 also, reflected by the reflecting surface 3a of the reflecting member 3 so as to be converted into a parallel light flux. In other words, the light flux emitted from the light emission point 1a would be focused at infinity.

In practice, this light flux is rarely delivered to the surface of the original (not shown). However, since every intermediate cross sectional shape between those shown in FIG. 2 and FIG. 3 converts, with its portion of reflecting surfaces 3a, a portion of the light flux into a parallel light flux and emits it, line illumination that is uniform along the reading line direction is realized, so that even if a plurality of illumination units 11 is arranged in the X-direction, the light fluxes emitted from the illumination apparatus can be mixed uniformly without ripple.

In order to preserve such uniformity, it is desirable that the angle of the sector through which the reflecting surface Rm is formed be equal to or more than 90 degrees. If the angle is less than 90 degrees the directivity of the light fluxes emergent from the reflecting surface Rm becomes too sharp, so that ripple in the illumination intensity (i.e. unevenness in illumination) would tend to occur at the overlapping portions of the illumination areas. This might invite deterioration of image quality of the image reading apparatus especially when a positional displacement in the up and-down direction of an original occurs.

As per the above, in this embodiment, each reflecting surface 3a of the reflecting member 3 is of a form of a curved surface that is formed by rotating a parabola about a rotation axis Ls that includes the focus of the parabola or a point in the vicinity of the focus. With this feature, a light flux traveling away from the reading line direction is collected or converged appropriately, so that uniform line illumination can be realized. In addition, effective line illumination can be realized by setting the number and density of the illumination units 11 having the light sources 1 (or light emission points 1a) and the optical elements 3 appropriately in accordance with the size of the original and the required light quantity. Furthermore, since each reflecting surface 3a is formed to have a rotated parabola shape, the shape is not complex and the invention can be realized using the same shape that is symmetry with respect to the rotation axis Ls.

In this embodiment, the reflecting surfaces 3a are formed as portions of the inner side of a curved surface that is formed by rotating a parabola as a quadratic curve about a rotation axis including its focus or a point in the vicinity of the focus, and two reflecting curved surfaces thus formed that are of the same shape and symmetrical with each other have been described in the foregoing. In practice, however, the two reflecting surfaces may be asymmetrical, or the illuminating directions for the two curved surfaces may be set independently from each other in accordance with the area to be illuminated.

It should be noted that the purpose of the reflecting curved surface is attained only if a reflected light flux is delivered to a predetermined area to be illuminated. Therefore, it would also be effective to form a microstructure on the reflecting surface to impart a diffusing property having a reflection directivity to the surface in order to reduce requirements for its manufacturing or assembling accuracy. Alternatively, the curved surface shape may be formed by approximation with a polyhedral shape that behaves in substantially the same manner as a curved surface.

Second Embodiment

Figure 5:
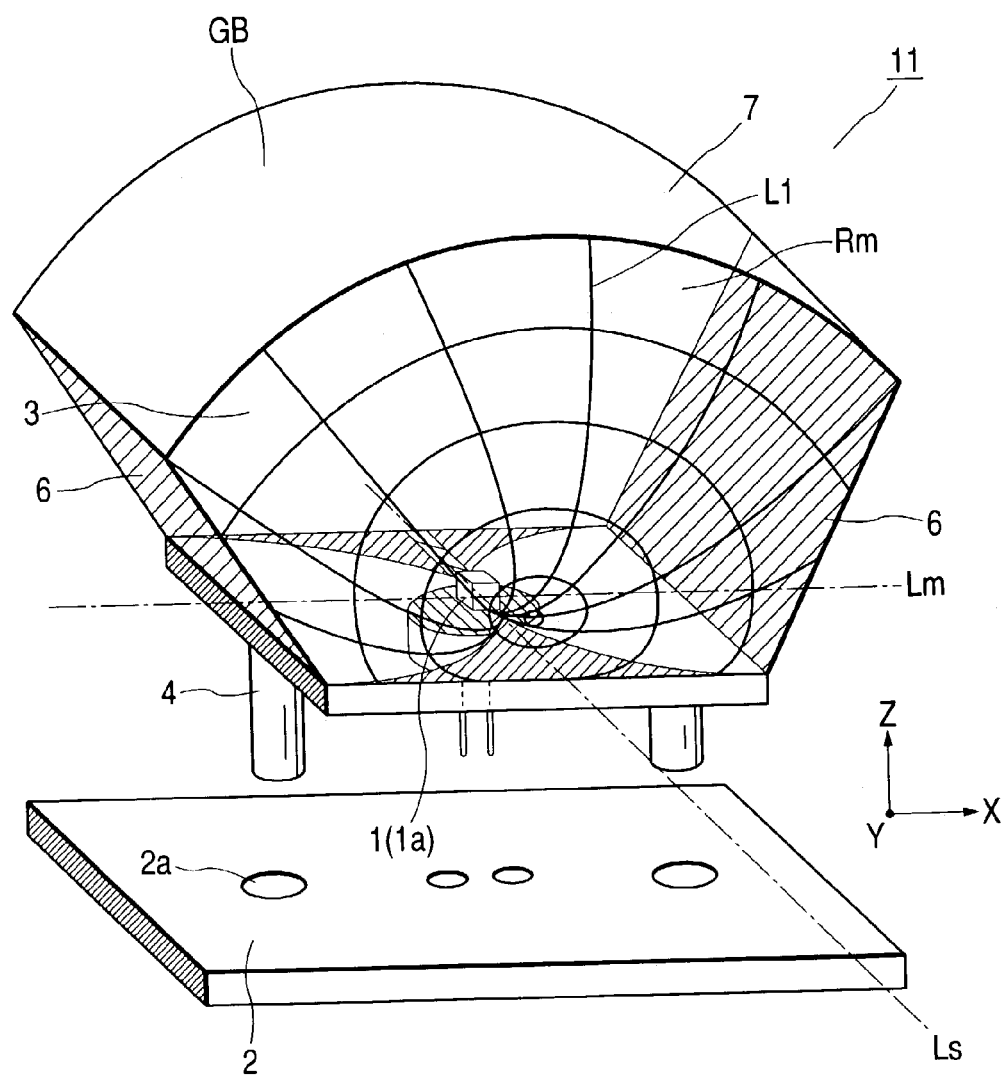
FIG. 5 is a perspective view schematically showing the principal portion of a second embodiment of the present invention.
Figure 6:
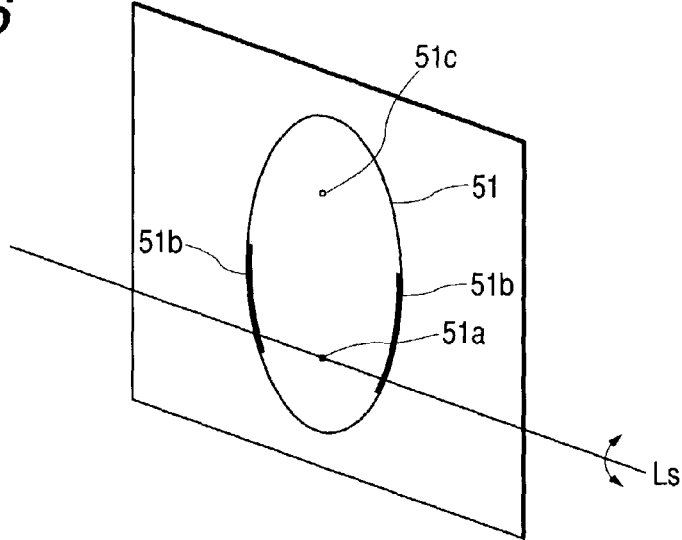
FIG. 6 is a drawing illustrating how a portion of an ellipse forms a reflecting surface.

FIG. 5 is a perspective view showing the principal part of an illumination apparatus as a second embodiment of the present invention. FIG. 6 is a diagram illustrating how portions of an ellipse are used as reflecting surfaces. In FIG. 5, elements that are the same as those shown in FIG. 1 are designated with the same reference numerals.

In this embodiment, a reflecting surface(s) 51b; is formed as a portion(s) of the inner side of a curved surface that is formed by rotating an ellipse 51 about a rotation axis Ls that includes one of the focuses of the ellipse 51 or a point 51a near the focus while changing the shape of the ellipse 51 in accordance with rotational angle about the rotation axis Ls.

Specifically, when the shape of the curved surface is formed, the shape of the ellipse is varied in accordance with the rotational angle about the rotation axis Ls in such a way that the other focus of the ellipse or a point 51c near the other focus is positioned on a virtual line that is parallel to an image reading line Lr.

The above-mentioned curved surfaces has a surface shape that is formed when the ellipse is rotated about the rotation axis Ls through the angular range, from a reference position, of ±45° to ±90°.

Figure 7:
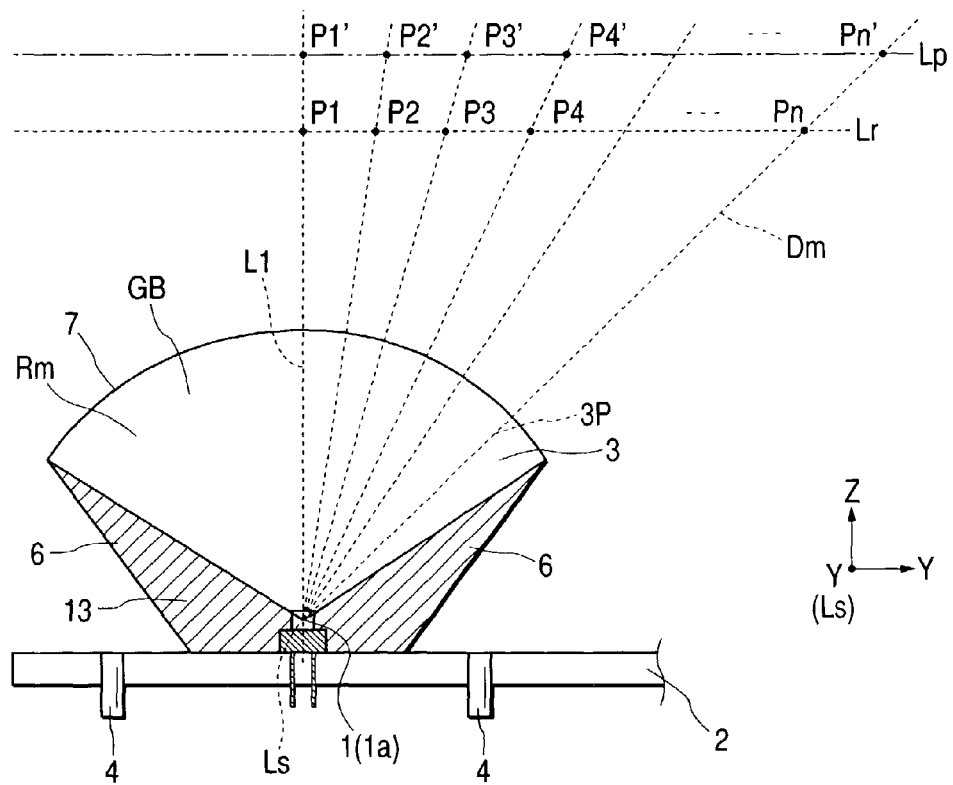
FIG. 7 is a cross sectional view taken at X-Z plane in FIG. 5 (i.e. a side view).

FIG. 7 is a cross sectional side view taken at X-Z plane of FIG. 5. FIG. 7 illustrates the principle for defining the shape of the reflecting surface Rm of the reflecting member 3.

In FIG. 7, reference sign GB designates a transparent medium (e.g. a plastic or glass) that is disposed in a space to which the reflecting surface Rm is opposed. The medium GB covers the light source 1. The reflecting member 3 is disposed on the medium GB.

In FIG. 5, there is illustrated a semiconductor light emitting device (i.e. the light source) 1 generally having a lens hood. The reflecting surface Rm whose line of intersection with a plane including the straight line Ls constitutes an ellipse having a focus at the light emission point 1a is provided on a part of a lens hood portion of the semiconductor light emitting device 1 having electrically conductive leads for wiring provided in advance. After the optical element 3 is mounted on the substrate 2 with positioning pins (i.e. assembling members) formed on the bottom, the electrically conductive leads are soldered.

FIG. 7 is a side view showing this state, wherein straight line Lr is a virtual line along which reading of an image is assumed to be performed. Here, a description will be made of how the shape of the reflecting surface(s) Rm is determined. When reading points p1, p2, p3, p4, . . . , and pn on the image reading line Lr are arbitrary designated, the line of intersection 3P of the plane Dm that includes point pn and the straight line Ls and the reflecting surface Rm of the reflecting member 3 has one of the focuses at the position of the light source 1. The other focus pn' (which focus pn' is determined taking into account the difference in media) is present on the straight line including the light source 1 and the point pn, and the straight line Lp including points pn' (n=1, 2, 3, . . . ) is parallel to the reading line Lr. The reflecting surface Rm is so determined that all of the above conditions are met.

As per the above, the reflecting surface (curved surface) Rm images the light flux emitted from the light emission point 1a to form a focal line in a one-dimensional direction.

With the above-described arrangement, a light flux emitted from the light source is reflected by the reflecting surfaces Rm so that a smooth focal line is formed in parallel with the reading line Lr. The intensity of this line illumination becomes low as the position changes from its center to the periphery. Therefore, a plurality of such line illumination structures are used in an overlapping manner to attain effective line illumination.

In addition, in order to enhance efficiency of illumination, a light flux incident on a hatched portion 13 in FIG. 7 is adapted to be reflected by a reflecting surface 6, so that the light is efficiently used. For example, if the hatched portion 13 is formed as a shape of paraboloid, the shape of the reflecting surface 6 may be a fine cylindrical surface or a Fresnel reflective surface.

Figure 8:
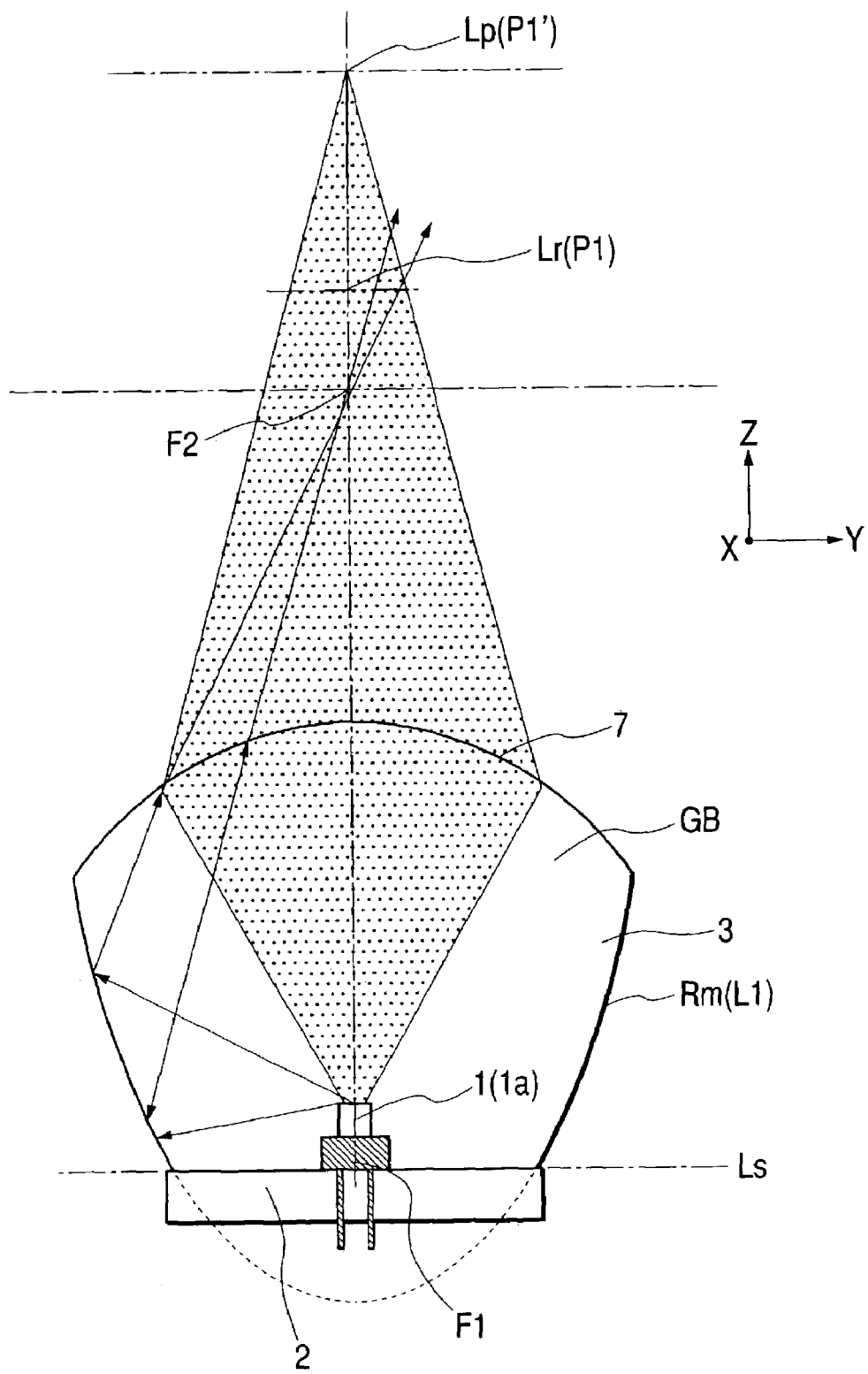
FIG. 8 is a cross sectional view taken at Y-Z plane in FIG. 5 (i.e. a vertical cross sectional view).

FIG. 8 is a cross sectional view taken at Y-Z plane of FIG. 5, which corresponds to an arbitrary cross section including the straight line Ls.

In FIG. 8, a light flux emitted from the light emission point 1a provided at one of the focuses Fl is reflected by the reflecting surface Rm of the optical element 3 and then converged at the other focus F2. In connection with this, light converging point F2 is arranged at a position on the light source 1 side with respect to the reading line Lr, in order to enhance illumination efficiency.

In order for illumination with a practically usable width to be provided efficiently, the light exit end surface 7 of the medium GB is designed to be a circular shape, a toric shape or a cylindrical shape. Therefore, the light flux emergent from the medium GB is substantially perpendicular to that surface 7.

The light exit end surface 7 is designed to have a predetermined power in the direction of line Ls. Alternatively, the light exit end surface 7 may be a flat plane.

The above-mentioned predetermined power is determined in such a way that a diverging light flux directly comes from the light source is converged outside the reading line Lr so as to realize a limited width bf illumination on the reading line Lr and the light reflected by the reflecting surface Rm is converged inside the reading line so as to realize an illumination width substantially the same as said limited width on the reading line Lr.

More specifically, if the power of the light exit end surface is so arranged that the power gradually decreases as the position shifts from P1 to Pn in FIG. 7, conjugate relationship between the points P1' to Pn' and the light source 1a can be preserved. In addition, since the points P1' to Pn' are arranged on a straight line, it is possible to form a focal line with a high degree of uniformity. In other words, it is possible to form a focal line with a high degree of uniformity even for light fluxes that do not pass through the reflecting curved surface 3. In this case, the surface shape of the reflecting curved surface 3 should be changed in such a way that the synthetic focus position follows a linear trajectory, taking into account the abovementioned power of the light exit end surface. In this case, it would be also effective to design the shape of the light exit end surface 7 in such a way that it has a little diverging property in order to enhance the degree of uniformity of the illumination area.

When the light exit end surface 7 is designed to be a cylindrical surface without said power being imparted, the shape of the reflecting curved surface 3 would be obtained by cutting elliptic cylinder in a circular arc manner with the light source being the center. Therefore, its manufacturing process can be greatly simplified. While in the foregoing, various combinations have been described, the combination may freely be made, and it is apparent that they may be adopted separately or in combination without any problem.

In this embodiment, the reflecting surfaces 3a are formed as portions of the inner surface that is formed by rotating an ellipse as a quadratic curve about a rotation axis including its focus or a point in the vicinity of the focus, and two reflecting curved surfaces thus formed that are of the same shape and symmetrical with each other have been described in the foregoing. In practice, however, the two reflecting surfaces may be asymmetrical, or the positions of the focuses of the two curved surfaces may be set independently from each other in accordance with the area to be illuminated, or the shape of one of the curved surfaces may be such a shape that has multiple focuses.

It should be noted that the purpose of the reflecting curved surface is attained only if a reflected light flux is delivered to a predetermined area to be illuminated. Therefore, it would also be effective to form a microstructure on the reflecting surface to impart a diffusing property having a reflection directivity to the surface in order to reduce requirements for its manufacturing or assembling accuracy. Alternatively, the curved surface shape may be formed by approximation with a polyhedral shape that behaves substantially the same as a curved surface.

In the case of the illumination apparatus that uses multiple illumination units 11 having optical elements 3 and the light sources 1 to illuminate a surface to be illuminated (i.e. the surface of an original) with light fluxes from light emission points via the optical elements, the illumination units 11 should be arranged in parallel with the direction of the reading line Lr (i.e. X-direction).

Third Embodiment

Various light sources have been used in image reading apparatus such as facsimile machines or image scanners for illuminating originals. As such a light source, an LED has been attracting attention, since it is advantageous for its low energy consumption and its high efficiency.

In most cases, manufacturers of image reading apparatus purchase such light sources from manufacturers of the light sources and use (i.e. assemble) them in image reading apparatus. In other words, the user manufacturer of the light sources use them in various apparatus, and the optimal form of the light sources varies depending on the apparatus in which they are used. Therefore, from the standpoint of the manufacturer of the light sources, it is efficient to manufacture light sources that are as versatile (or general) as possible.

In the case of LED light sources for example, a ready-made LED provided with a dome-like resin cover (an LED having a dome-like lens) is well known.

For example, Japanese Utility Model Application Laid-Open No. 6-44267 discloses assembling that type of LEDs in a line and adjusting them in the optical axis direction to reduce the degree of unevenness of light quantity.

However, such a light source provided with a dome-like resin cover requires high accuracy in positional relationship between the dome-like lens (collector lens) and the light emission point. In addition, the conventional dome-like shape is not optimal for use in an apparatus for providing line illumination.

In view of the above situation, a light source apparatus (i.e. an illumination system) using a combination of an optical element that is optimal for line illumination and a light source has been proposed. However, the shape of the optical element used in this light source apparatus is optimized for use in an individual type of the light source apparatus. Viewed from the standpoint of a manufacturer of light sources, a resin cover manufactured with the shape optimized for the above-mentioned apparatus has low versatility, since the optimal shape varies depending on its application. Therefore, the optimized shape suffers from a problem in its application.

An object of the present invention is to provide a light source apparatus and an illumination apparatus using the light source apparatus that uses a general light source such as an LED manufactured by a light source manufacturer without any modification, while illuminating a required illumination area efficiently and realizing sufficient accuracy required by users.

Figure 13:
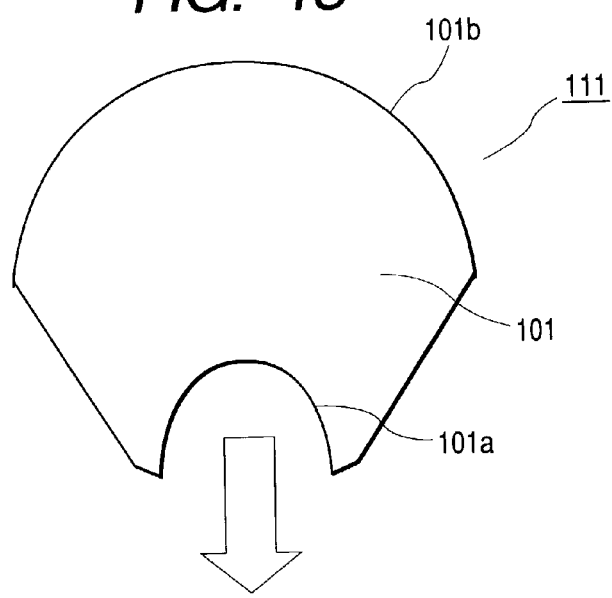
FIG. 13 is a cross sectional view schematically showing the principal portion of a third embodiment of the present invention.
Figure 14:
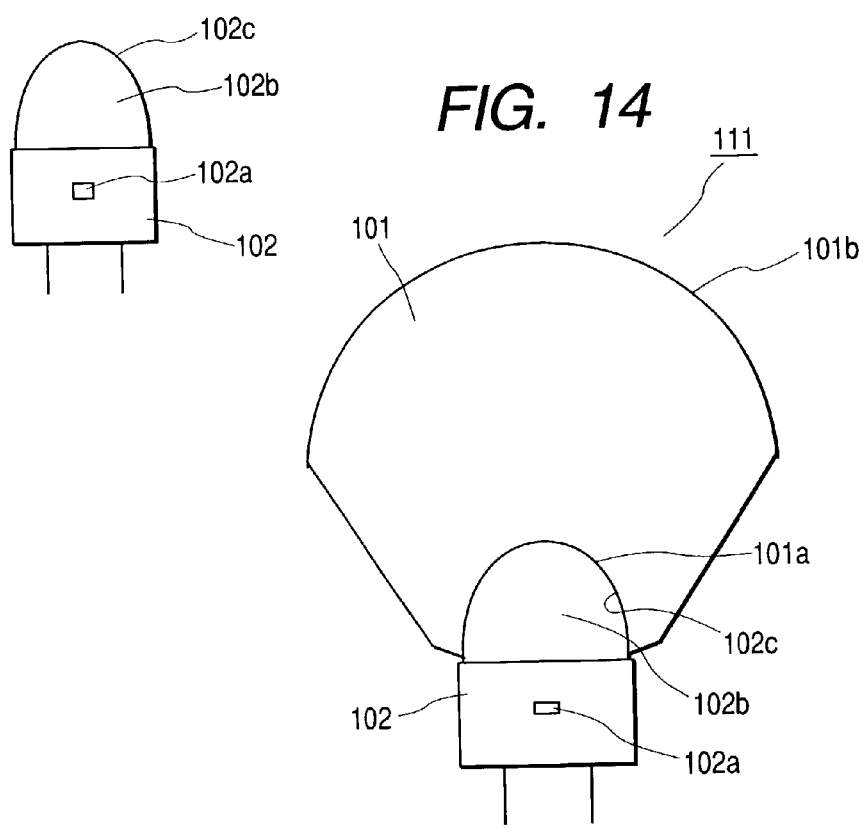
FIG. 14 is a cross sectional view schematically showing the principal portion of the third embodiment of the present invention.

FIG. 13 is a cross sectional view of the principal portion of an illumination apparatus as a third embodiment of the present invention. FIG. 14 is a cross sectional view of the principal portion, in which an optical element 101 and a light source portion 102, which are separated in FIG. 13, are connected together.

In FIGS. 13 and 14, reference numeral 111 designates a light source device having the optical element 101 and the light source portion (a light source) 102 composed of an LED having a dome-like lens.

The light source portion 102 has a light emitting portion 102a, a ready-made transparent member (i.e. a dome-like lens) 102b having a light-collecting function on the light emission side of the light emitting portion.

The optical element 101 is made of a material that is transparent to the light emitted from the light emitting portion 102a. The optical element 101 has a fitting portion 110a having a shape compliant with the shape of the light emitting surface 102c of the ready-made transparent member, and a light emitting surface 101b that changes the state of the light flux that has entered the optical element 101 from the fitting portion 101a to emit it. Here, the word "transparent" should be interpreted in relation to the principal wavelength of the light emitted from the light emitting portion, and it does not necessarily mean transparent to the visible light range. Furthermore, the word "transparent" means that absorption is low. In addition, a surface of each portion may have a diffusing property in order to reduce sensitivity in positional accuracy.

The ready-made transparent member 102b of the light source portion 102 is fitted into and secured to the fitting portion 101a of the optical element 101 so that the light flux emitted from the light emitting portion 102a would be delivered to a predetermined illumination area via the light emitting surface 101b of the optical element. In other words, the fitting portion 101a and the readymade transparent member 102b are secured together after they are so aligned that illumination distribution in the above-mentioned predetermined illumination area is adjust to be in a predetermined range.

As described above, the optical element 101 has a fitting portion into which the ready-made transparent member 102b can be fitted. When they are fitted and secured together without a space therebetween, the state shown in FIG. 14 is realized. Since in this fitted and secured state, the accuracy of the position of the light emitting portion 102a is determined by the accuracy of the position of the light source portion 102, it is superior in productivity in the case in which the designed shape of the optical element 101 is not sensitive to (i.e. easily influenced by) the position of the light source portion 102. In addition, it is possible to reduce cost by virtue of its simple structure.

As per the above, in this embodiment the fitting portion 101a into which the ready-made transparent member 102b that is generally manufactured by a light source manufacturer can be fitted is provided on the optical element 101 made of a material transparent to the light emitted from the light emitting portion, and the optical element 101 and the light source portion 102 are joined together. Thus, the user manufacturer can optimally use light sources while preserving versatility of the light sources supplied by light source manufacturers.

Fourth Embodiment

FIG. 15 is a cross sectional view of the principal portion of an illumination apparatus as a fourth embodiment of the present invention. In FIG. 13, the elements the same as those shown in FIG. 13 are designated with the same reference signs.

This fourth embodiment differs from the above-described third embodiment in that a space 105 is formed between a fitting portion 101a of an optical element 101 and a ready-made transparent member 102b of a light source portion 102, and the space 105 is filled with transparent adhesive so that the optical element 101 and the light source portion 102 are attached. The structure and the optical functions of the fourth embodiment other than the above are the same as those of the third embodiment, and therefore the same advantageous effects can be carried out in this fourth embodiment too.

When illumination efficiency of the light source apparatus (i.e. an illumination system) is increased, the typical degree of manufacturing precision of light sources generally available in the market does not meet the requirement for accuracy in the position of the optical element relative to the light emitting portion 102a.

In view of this fact, in this embodiment, the size of the fitting portion 101a is designed to be a little larger than the size of the ready-made transparent member 102b of the light source portion 102, and the space 105 formed between them is filled with a transparent adhesive 103, so that the light source portion 102 is shifted in the fitting portion 101a. Thus, the position adjustment such as an adjustment of the optical axis is effected, and then the adhesive 103 is cured so that the optical element 101 and the light source portion 102 are joined. In connection with this, the position adjustment may be carried out while observing outputs of multiple light receiving sensors 104 disposed in the illumination area. The light receiving sensors 104 may be PIN photo diodes, and the adjustment may be performed while measuring symmetry in the light quantity distribution, or alternatively, the luminance distribution itself may be measured by means of a certain element such as a CCD to perform the position adjustment with a higher degree of accuracy.

The above-mentioned curing may be performed naturally, but use of a heat curing adhesive or a UV curing adhesive would be more desirable in order to increase productivity. In the example shown in FIG. 15, UV light is externally radiated for curing, a heating effect or light emission of the light source itself may serve as a heat source for provisional curing or a UV light source with its heat generation or light emission, if the type of the light source is suitable for those purposes.

As per the above, in this embodiment a space 105 is formed between the fitting portion 101a of the optical element 101 and the ready-made transparent member 102b of the light source portion 102, and the space 105 is filled with the adhesive 103. Thus, by the same token as the third embodiment, the user manufacturer can optimally use light sources while preserving versatility of the light sources supplied by light source manufacturers.

In this embodiment, if the optical element 101 and the adhesive 103 have a refractive index substantially the same as that of the resin of the ready-made transparent member (or dome-like lens), the influence of refraction at the joining portion can be suppressed. This makes designing of the apparatus easy. In addition, it is also possible to enhance efficiency in taking out a light flux that would be otherwise totally reflected at the surface of the ready-made transparent member 102b.

Furthermore, if the coefficient of thermal expansion of the optical element 101, that of the ready-made transparent member 102b and that of the transparent adhesive 103 after cured are the same, distortion of their shapes caused by environmental changes during the light emission can be suppressed. Here, the transparent adhesive refers to an adhesive that does not positively absorb the light emitted from the light source. There is no problem if the transparent adhesive has a diffusing property after it is cured. Furthermore, this would be rather, preferable, since this might reduce the sensitivity to accuracy in the position of the light source.

(Modifications)

In the following, modifications of the embodiments 3 and 4 will be described.

As shown in FIG. 16, fitting and securing of the light source portion 102 to the optical element 101 may be performed by lightly pressing the ready-made transparent member 102b of the light source portion 102 into the fitting portion, which has a shape corresponding to the shape of the transparent member 102b, to partially deform the optical element.

In the above-described third and fourth embodiments described above, the descriptions have been made in connection with such a light source portion that has an LED with a dome-like lens. However, the form of the light source portion is not limited to this, but light source portions having other various shapes such as a rectangular parallelepiped or a circular cylinder may also be used in a similar manner.

The shape of the optical element is not limited to the dome-like shape indicated in the third and fourth embodiments, but the present invention is applicable to optical elements formed with fitting portions 101a that have other shapes in accordance with light source devices used for various applications.

(Some Modes of the Invention)

While various examples and embodiments of the present invention have been described, a person skilled in the art would understand that the concept and scope of the invention are not limited to the specific descriptions and drawings made in the specification but cover various modifications and changes within the scope of the annexed claims.

In the following, some mode in accordance with the third and fourth embodiments of the present invention will be mentioned.

(Mode 1)

A light source apparatus having a light source portion and an optical element for causing a light flux from the light source portion to be incident on a predetermined illumination area, wherein the light source portion has a transparent member having a function of collecting light on the light emission side (or emergence side) of its light emitting portion, the optical element has a fitting portion having a shape corresponding to the shape of the light emergence surface of the transparent member and a light emergence surface which changes the state of the light flux from the fitting portion when the light flux is emitted from it, and the transparent member of the optical element is fitted and secured to the fitting portion of the optical element.

(Mode 2)

The light source apparatus according to mode 1, wherein the transparent member of the light source portion is fitted and secured to the fitting portion of the optical element by weak press fitting.

(Mode 3)

The light source apparatus according to mode 1, wherein a space is formed between the fitting portion of the optical element and the transparent member of the light source portion and said space is filled with a transparent adhesive.

(Mode 4)

The light source apparatus according to mode 1, wherein the fitting portion of the optical element and the transparent member of the light source portion are secured after they are positioned in such a way that the luminance distribution in said predetermined illumination area is in a predetermined range.

(Mode 5)

An illumination apparatus provided with one or more light source apparatus according to either one of the above-described modes 1 to 4, to illuminate a surface to be illuminated.

(Mode 6)

An image reading apparatus that read image information using the illumination apparatus described in mode 5 and imaging means for imaging the image information illuminated by the illumination apparatus onto a one-dimensional line sensor.

(Image Reading Apparatus)

Figure 9:
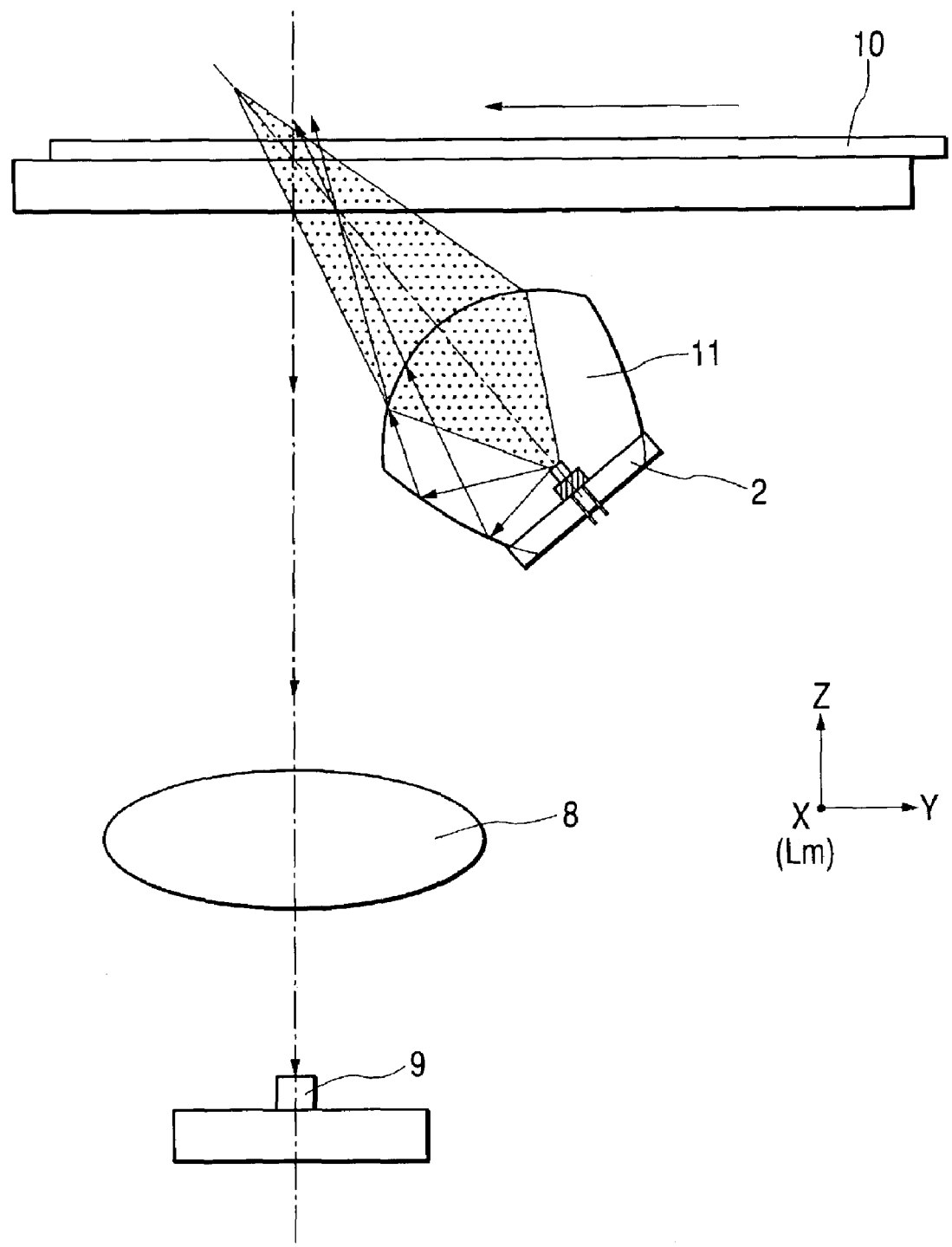
FIG. 9 is a cross sectional view schematically showing the principal portion of an image reading apparatus provided with an illumination apparatus according to the present invention.

FIG. 9 is a cross sectional view schematically showing the principal portion of an image reading apparatus in which an illumination apparatus according to any one of the first to fourth embodiments is used. The image reading apparatus shown in FIG. 9 uses multiple illumination units 11 arranged in the direction of line Lm (i.e. X-direction) to illuminate a reflective original 10 at high efficiency.

In the apparatus shown in FIG. 9, the illumination units 11 positioned on a substrate 2 forms a uniform focal lines that do not have directivity with respect to the direction of straight line Lm on a reading line Lr of the reflective original 10, and the focal lines are synthesized smoothly. Thus, an efficient line illumination is realized.

In the apparatus shown in FIG. 9, an image of the reflective original illuminated by the light flux emitted from the illumination units 11 is formed (or imaged) on a one-dimensional line sensor (a CCD) 9 by an imaging lens 8 serving as imaging means. The reflective original 10 is shifted in the direction perpendicular to the one-dimensional line sensor 9, so that image information of the reflective original 10 is read.

(Image Reading Apparatus 2)

Figure 10:
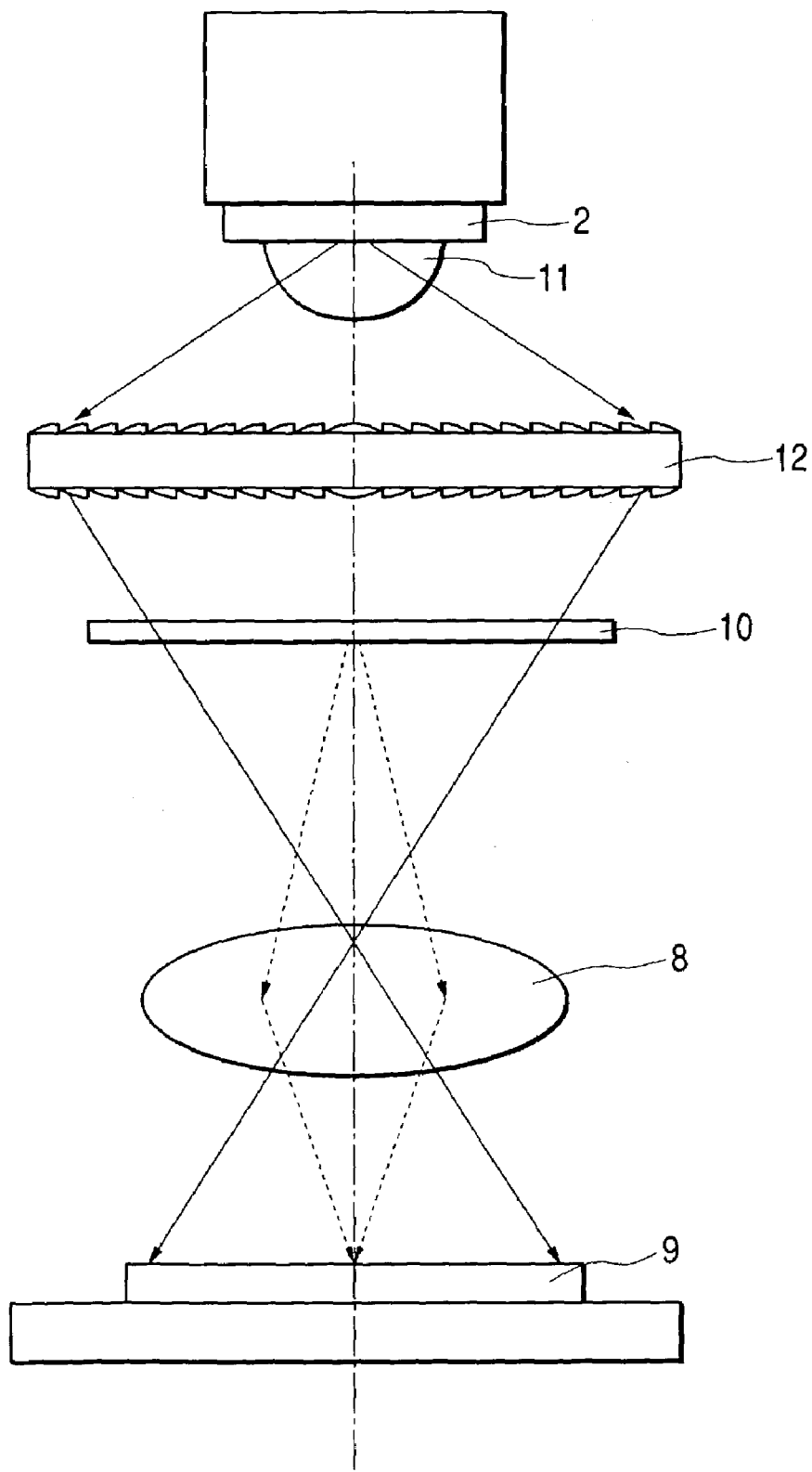
FIG. 10 is a cross sectional view schematically showing the principal portion of an image reading apparatus provided with an illumination apparatus according to the present invention.

FIG. 10 is a cross sectional view schematically showing the principal portion of an image reading apparatus in which an illumination apparatus according to any one of the first to fourth embodiments is used. The image reading apparatus shown in FIG. 10 uses a single illumination unit 11.

In the image reading apparatus shown in FIG. 9, the light flux emitted from the illumination unit 11 is deflected by an optical element 12 such as a Fresnel lens to the direction toward entrance pupil of an imaging lens 8 so as to be delivered to a one-dimensional line sensor (a CCD) 9, wherein the system functions as a Koehler illumination system. This light flux is first imaged in air after it has passed through an optical element 12. Then an image of a reflective original disposed near the focal line is formed (or imaged) on the one-dimensional line sensor (CCD) 9 by the imaging lens 8. The reflective original 10 is shifted in the direction perpendicular to the plane of the drawing sheet of FIG. 10, so that image information of the reflective original 10 is read.

(Image Reading Apparatus 3)

Figure 11:
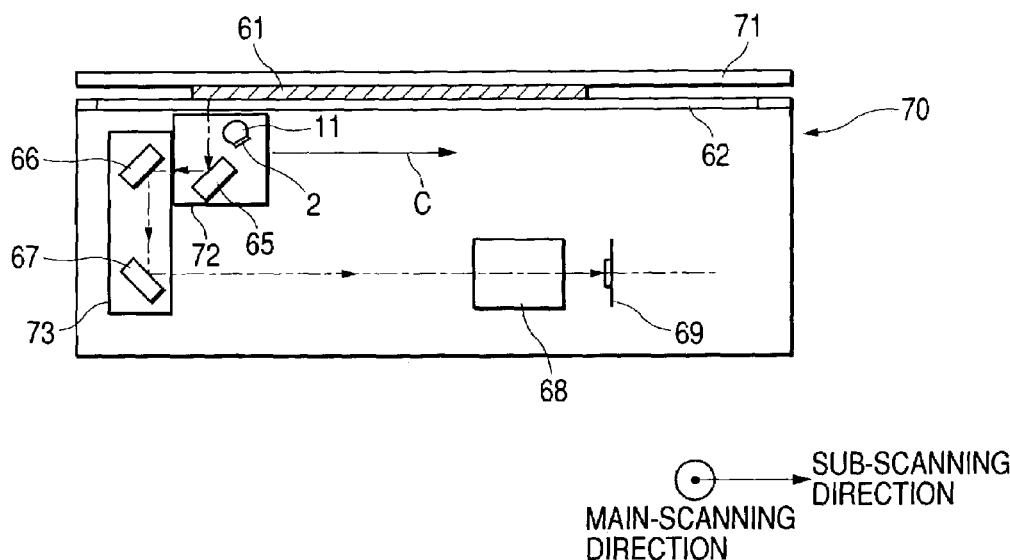
FIG. 11 is a cross sectional view schematically showing the principal portion of an image reading apparatus provided with an illumination apparatus according to the present invention.

FIG. 11 is a cross sectional view schematically showing the principal portion of an image reading apparatus of a 1:2-scanning type in which an illumination apparatus according to any one of the first to fourth embodiments is used.

In the image reading apparatus shown in FIG. 11, an original 61 is illuminated by the light flux emitted from an illumination unit 11, and the light path of the light flux reflected from the original is bent by first, second and third reflecting mirrors 65, 66 and 67 within the body of the apparatus, so that an image is formed on a one-dimensional line sensor (a CCD) 69 by an imaging lens 68 serving as imaging means. In this process, the first, second and third reflecting mirrors 65, 66 and 67 are moved for scanning in the sub-scanning direction while scanning in the main-scanning direction is performed electrically so that image information of the original would be read. In this process, the shift amount of the second and third reflecting mirrors 66 and 67 are adapted to be half the shift amount of the first reflecting mirror 65, in order to maintain the distance between the original and the one-dimensional line sensor constant.

(Image Reading Apparatus 4)

FIG. 11 is a cross sectional view schematically showing the principal portion of an image reading apparatus having an integrated carriage in which an illumination apparatus according to any one of the first to fourth embodiments is used.

Figure 12:
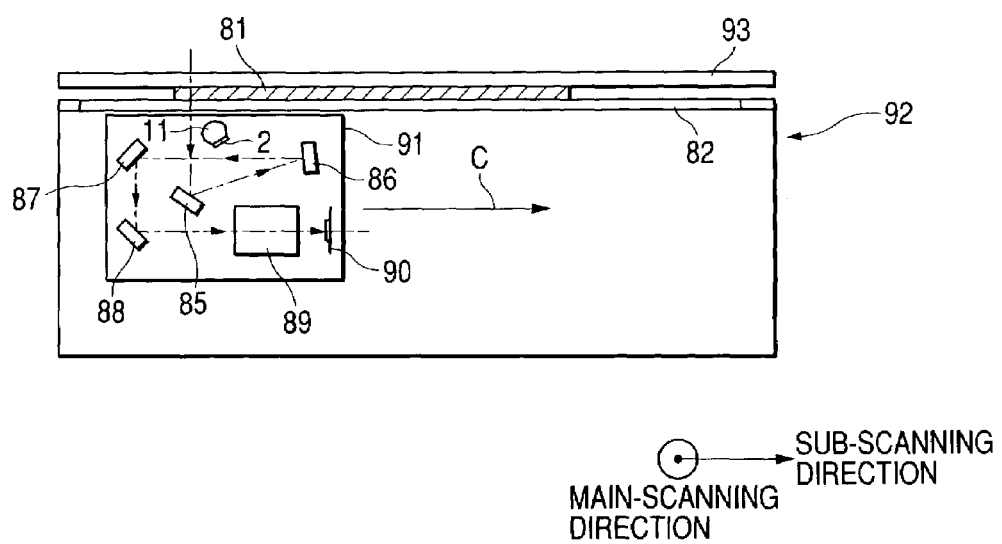
FIG. 12 is a cross sectional view schematically showing the principal portion of an image reading apparatus provided with an illumination apparatus according to the present invention.

In the image reading apparatus shown in FIG. 12, an original 81 is illuminated by the light flux emitted from an illumination unit 11, and the light path of the light flux reflected from the original is bent by first, second and third reflecting mirrors 85, 86 and 87 within the carriage 91, so that an image is formed on a one-dimensional line sensor (a CCD) 90 by an imaging lens 89 serving as imaging means. Image information of the original 81 is read while the carriage 91 is moved in the direction of arrow C shown in FIG. 12 (i.e. the sub-scanning direction) by a sub-scanning motor (not shown).

The above-described examples may be applied to various color image reading apparatus such as digital color copying machines and color image scanners.

As has been described in the foregoing, in the invention, an optical element having a reflecting surface composed as a portion of the inner side of a curved surface and a light source are used with 1 to 1 relationship. With this structure, the structure of the optical element can be simplified and the size of the optical element can be reduced, while uniform line illumination is realized. In addition, adjustment for making the line illumination uniform can be additionally performed at the time of assembling. Thus, a versatile optical element and an illumination apparatus having such an optical element can be realized only by adjusting the number and the degree of density of the illumination units in accordance with the size of an original and specifications of the apparatus.

What is claimed is:

1. An illumination apparatus comprising:
   an optical element having a reflecting surface that is an inner surface of a curved surface formed by rotating a parabola about a rotation axis; and
   light source means having a light emission point at a focal point of the parabola,
   wherein the rotation axis is defined within the plane of the parabola, and
   wherein the rotation axis is a straight line including the focal point of the parabola and orthogonal to a line connecting the focal point of the parabola and the vertex of the parabola.

2. An illumination apparatus according to claim 1, wherein the curved surface has a shape that is formed when the parabola is rotated about the rotation axis through the angular range of ±45° to ±90° from a reference position.

3. An illumination apparatus according to claim 1, wherein said optical element has a member used for assembling that is provided on a surface other than the reflecting surface.

4. An illumination apparatus according to claim 1, wherein said optical member has a transparent member provided in a part of a space to which the reflecting surface is opposed.

5. An illumination apparatus according to claim 1, further comprising:
   at least one illumination unit, said illumination unit including said optical element,
   wherein said illumination apparatus illuminates a surface to be illuminated with a light flux from the light emission point via said optical element.

6. An image reading apparatus for reading image information, comprising:
   an illumination apparatus according to claim 5; and
   imaging means for imaging image information that is linearly illuminated by said illumination apparatus onto a one-dimensional line sensor.

7. An illumination apparatus according to claim 1, wherein said illumination apparatus has plural illumination units that are disposed on a first virtual straight line that is formed by a curved surface of the light emission point.

8. An illumination apparatus comprising:
   an optical element having a reflecting surface which is an inner surface of a curved surface formed by rotating an ellipse about a rotation axis; and
   light source means having a light emission point at one of two focal points of the ellipse,
   wherein the rotation axis is defined within a cross-section including the ellipse,
   wherein the rotation axis is a straight line including one of the two focal points of the ellipse and is orthogonal to a straight line connecting the two focal points of the ellipse, and
   wherein the curved surface has a shape that is formed when the ellipse is rotated about the rotation axis through the angular range of ±45° to ±90° from a reference position.

9. An illumination apparatus according to claim 8, wherein said optical element has a member used for assembling that is provided on a surface other than the reflecting surface.

10. An illumination apparatus according to claim 8, wherein said optical member has a transparent member provided in a part of a space to which the reflecting surface is opposed.

11. An illumination apparatus according to claim 8, further comprising:
    at least one illumination unit, said illumination unit including said optical element,
    wherein said illumination apparatus illuminates a surface to be illuminated with a light flux from the light emission point via said optical element.

12. An illumination apparatus according to claim 8, wherein the transparent member has an exit end surface of a substantially concentric circular arc shape with a center positioned on the rotation axis.

13. An illumination apparatus according to claim 8, wherein the exit end surface of the transparent member does not have a curvature in the direction parallel to the rotation axis.

14. An illumination apparatus comprising:
    an optical element having a reflecting surface which is an inner surface of a curved surface formed by rotating an ellipse about a rotation axis; and
    light source means having a light emission point at one of two focal points of the ellipse,
    wherein the rotation axis is defined within a cross-section including the ellipse,
    wherein the rotation axis is a straight line including one of the two focal points of the ellipse and is orthogonal to a straight line connecting the two focal points of the ellipse,
    wherein said optical member has a transparent member provided in a part of a space to which the reflecting surface is opposed,
    wherein the transparent member has an exit end surface of a substantially concentric circular arc shape with a center positioned on the rotation axis,
    wherein the exit end surface of the transparent member has a curvature in the direction parallel to the rotation axis,
    wherein the curvature varies in such a way that the power gradually decreases as the position shifts away from a first virtual straight line of the focus, and
    wherein the shape of the curved surface is such that the trajectory of the synthesized focus position is determined taking into account the curvature imparted to said exit end surface, corresponding to a second virtual straight line.

15. An illumination apparatus according to claim 14, wherein with the curvature varying in such a way that the power gradually decreases as the position shifts away from the first virtual straight line of the focus, the image position of the light emission point is on the first virtual straight line.

16. An illumination apparatus comprising:
    an optical element having a reflecting surface which is an inner surface of a curved surface formed by rotating an ellipse about a rotation axis;
    light source means having a light emission point at one of two focal points of the ellipse; and
    at least one illumination unit, said illumination unit including said optical element,
    wherein the rotation axis is defined within a cross-section including the ellipse,
    wherein the rotation axis is a straight line including one of the two focal points of the ellipse and is orthogonal to a straight line connecting the two focal points of the ellipse,
    wherein said illumination apparatus illuminates a surface to be illuminated with a light flux from the light emission point via said optical element, and
    wherein said illumination apparatus has a multiple number of said illumination units, and said multiple illumination units are disposed on a first virtual straight line that is formed by a curved surface of the light emission point.

17. An image reading apparatus for reading image information comprising:
    an illumination apparatus comprising:
        an optical element having a reflecting surface which is an inner surface of a curved surface formed by rotating an ellipse about a rotation axis;
        light source means having a light emission point at one of two focal points of the ellipse; and
        at least one illumination unit, said illumination unit including said optical element,
        wherein the rotation axis is defined within a cross-section including the ellipse,
        wherein the rotation axis is a straight line including one of the two focal points of the ellipse and is orthogonal to a straight line connecting the two focal points of the ellipse, and wherein said illumination apparatus illuminates a surface to be illuminated with a light flux from the light emission point via said optical element; and imaging means for imaging image information that is linearly illuminated by said illumination apparatus onto a one-dimensional line sensor.

18. An illumination apparatus comprising:

an optical element having a reflecting surface which is an inner surface of a curved surface formed by rotating an ellipseabout a rotation axis;

light source means having a light emission point at one of two focal points of the ellipse; and at least one illumination unit, said illumination unit including said optical element, wherein the rotation axis is defined within a cross-section including the ellipse, wherein the rotation axis is a straight line including one of the two focal points of the ellipse and is orthogonal to a straight line connecting the two focal points of the ellipse, wherein said illumination apparatus illuminates a surface to be illuminated with a light flux from the light emission point via said optical element, and wherein the curved surface images a light flux emitted from the light emission point to form a focal line in a one-dimensional direction.

19. An illumination apparatus according to claim 18, wherein said illumination apparatus has a multiple number of said illumination units, and said multiple illumination units are disposed on a first virtual straight line that is formed by the curved surface of the light emission point.

20. An image reading apparatus for reading image information comprising:

an illumination apparatus according to claim 19; and imaging means for imaging image information that is linearly illuminated by said illumination apparatus onto a one-dimensional line sensor.

21. An image reading apparatus for reading image information comprising:

an illumination apparatus according to claim 18; and imaging means for imaging image information that is linearly illuminated by said illumination apparatus onto a one-dimensional line sensor.

* * * * *

UNITED STATES PATENT AND TRADEMARK OFFICE
CERTIFICATE OF CORRECTION

PATENT NO. : 7,336,403 B2
APPLICATION NO. : 10/439239
DATED : February 26, 2008
INVENTOR(S) : Motomu Fukasawa It is certified that error appears in the above-identified patent and that said Letters Patent is hereby corrected as shown below:

ON THE TITLE PAGE:
In item "(57) ABSTRACT," line 2, "and" should be deleted, and at line 4, "irrespective" should read -- irrespectively --.

COLUMN 1:
Line 45, "after" should read -- after being --.

COLUMN 3:
Line 2, "determine" should read -- determined by --.
Line 22, "on" should read -- one --.

COLUMN 4:
Line 54, "is" should read -- are --.

COLUMN 6:
Line 55, "51$b$;" should read -- 51$b$ --.

COLUMN 8:
Line 13, "flux" should read -- flux that --.

COLUMN 10:
Line 8, "110$a$" should read -- 101$a$ --.

COLUMN 11:
Line 59, "cured" should read -- being curved --.
Line 65, "rather," should read -- rather --.

COLUMN 12:
Line 11, "above-described" should be deleted.

COLUMN 13:
Line 7, "read" should read -- reads --.
Line 22, "forms a" should read -- forms --.

UNITED STATES PATENT AND TRADEMARK OFFICE
CERTIFICATE OF CORRECTION

PATENT NO. : 7,336,403 B2 Page 2 of 2
APPLICATION NO. : 10/439239
DATED : February 26, 2008
INVENTOR(S) : Motomu Fukasawa It is certified that error appears in the above-identified patent and that said Letters Patent is hereby corrected as shown below:

COLUMN 17:
    Line 10, "ellipseabout" should read -- ellipse about --.

Signed and Sealed this

Twenty-third Day of September, 2008

JON W. DUDAS
*Director of the United States Patent and Trademark Office*